(12) United States Patent
Suzuki et al.

(10) Patent No.: US 9,564,491 B2
(45) Date of Patent: Feb. 7, 2017

(54) SEMICONDUCTOR DEVICE

(71) Applicant: Kabushiki Kaisha Toshiba, Minato-ku (JP)

(72) Inventors: Mariko Suzuki, Yokohama (JP); Tadashi Sakai, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/963,825

(22) Filed: Dec. 9, 2015

(65) Prior Publication Data
US 2016/0172449 A1 Jun. 16, 2016

(30) Foreign Application Priority Data
Dec. 15, 2014 (JP) ................. 2014-253215

(51) Int. Cl.
| | | |
|---|---|---|
| *H01L 29/15* | (2006.01) | |
| *H01L 31/036* | (2006.01) | |
| *H01L 29/16* | (2006.01) | |
| *H01L 29/868* | (2006.01) | |
| *H01L 29/20* | (2006.01) | |
| *H01L 29/167* | (2006.01) | |
| *H01L 29/267* | (2006.01) | |
| *H01L 29/66* | (2006.01) | |

(Continued)

(52) U.S. Cl.
CPC ........ *H01L 29/1602* (2013.01); *H01L 29/155* (2013.01); *H01L 29/167* (2013.01); *H01L 29/2003* (2013.01); *H01L 29/267* (2013.01); *H01L 29/6603* (2013.01); *H01L 29/66219* (2013.01); *H01L 29/7371* (2013.01); *H01L 29/861* (2013.01); *H01L 29/868* (2013.01); *H01L 29/452* (2013.01)

(58) Field of Classification Search
USPC ............... 257/274, 256, 287, 504, E27.148, 257/E29.027–E29.028, E29.066–E29.067, 257/E29.194–E29.202, E21.382–E21.385, 257/E21.608–E21.613, E27.052, E27.079, 257/E29.036–E29.038, E29.046–E29.048, 257/E29.115, E29.196, E29.211–E29.225, 257/E21.371, E21.387, E21.403–E21.407, 257/E21.441, E21.445, E21.448–E21.452, 257/E21.115; 438/105, 47
See application file for complete search history.

(56) References Cited

U.S. PATENT DOCUMENTS

| | | |
|---|---|---|
| 5,436,505 A | 7/1995 | Hayashi et al. |
| 5,668,382 A | 9/1997 | Toda et al. |

(Continued)

FOREIGN PATENT DOCUMENTS

| | | |
|---|---|---|
| JP | 5-891 | 1/1993 |
| JP | 6-236855 | 8/1994 |

(Continued)

OTHER PUBLICATIONS

Extended European Search Report issued May 9, 2016 in Patent Application No. 15198747.6.

(Continued)

*Primary Examiner* — Tram H Nguyen
(74) *Attorney, Agent, or Firm* — Oblon, McClelland, Maier & Neustadt, L.L.P.

(57) ABSTRACT

According to one embodiment, a semiconductor device includes an n-type semiconductor layer, a first electrode, and a nitride semiconductor layer. The n-type semiconductor layer includes diamond. The nitride semiconductor layer is provided between the n-type semiconductor layer and the (Continued)

first electrode. The nitride semiconductor layer includes $Al_xGa_{1-x}N$ ($0 \leq x \leq 1$) and is of n-type.

18 Claims, 7 Drawing Sheets

(51) Int. Cl.
  *H01L 29/737* (2006.01)
  *H01L 29/861* (2006.01)
  *H01L 29/45* (2006.01)

(56) References Cited

U.S. PATENT DOCUMENTS

| | | | |
|---|---|---|---|
| 6,924,516 B2* | 8/2005 | Inoue | H01L 29/045 257/190 |
| 2002/0149033 A1* | 10/2002 | Wojtowicz | H01L 29/155 257/198 |
| 2002/0167029 A1* | 11/2002 | Koike | B82Y 20/00 257/201 |
| 2004/0227211 A1 | 11/2004 | Saito et al. | |
| 2007/0114539 A1* | 5/2007 | Suzuki | H01L 33/02 257/79 |
| 2010/0219418 A1* | 9/2010 | Sung | H01L 33/025 257/77 |
| 2011/0278586 A1* | 11/2011 | Ando | H01L 29/0649 257/76 |
| 2011/0291147 A1* | 12/2011 | Hu | H01L 33/40 257/99 |
| 2013/0153931 A1* | 6/2013 | Grotjohn | H01L 21/02376 257/77 |
| 2013/0181188 A1* | 7/2013 | Ooshika | H01L 29/15 257/13 |
| 2013/0259079 A1* | 10/2013 | Bhattacharya | H01S 5/3013 372/45.01 |
| 2015/0060885 A1* | 3/2015 | Suzuki | H01L 29/1602 257/77 |
| 2015/0380461 A1* | 12/2015 | Robin | H01L 27/156 257/88 |

FOREIGN PATENT DOCUMENTS

| | | |
|---|---|---|
| JP | 6-275554 A | 9/1994 |
| JP | 7-78784 | 3/1995 |
| JP | 9-312300 | 12/1997 |
| JP | 2001-77048 | 3/2001 |
| JP | 2004-342907 | 12/2004 |
| JP | 2007-96130 | 4/2007 |
| WO | WO 01/48796 A1 | 7/2001 |
| WO | WO 2015/198950 A1 | 12/2015 |

OTHER PUBLICATIONS

Kato Hiromitsu et al., "Low Specific Contact Resistance of Heavily Phosphorus-Doped Diamond Film", Applied Physics Letters, vol. 93, No. 20, XP012112532, Nov. 18, 2008, pp. 202103-1-202103-3.

Oyama Kazuhiro et al., "High Performance of Diamond p+-i-n+ Junction Diode Fabricated Using Heavily Doped p+ and n+ Layers", Applied Physics Letters, vol. 94, No. 15, XP012120857, Apr. 17, 2009, pp. 152109-1-152109-2.

Hiromitsu Kato et al., "Diamond Bipolar Junction Transistor Device with Phosphorus-Doped Diamond Base Layer", Diamond and Related Materials, vol. 27, XP028431453, Jul. 1, 2012, pp. 19-22.

C R Miskys et al., "AlN/diamond Heterojunction Diodes", Applied Physics Letters, vol. 82, No. 2, XP012034092, Jan. 13, 2003, pages 290-292.

T. Teraji et al. "Ga Ohmic Contact for N-Type Diamond by Ion Implantation", Applied Physics Letters, vol. 76, No. 10, Mar. 6, 2000, 4 pages.

Mariko Suzuki et al. "Electrical Characteristics of N-Type Diamond Schottky Diodes and Metal/Diamond Interfaces", Physica Status Solidi A, vol. 203, No. 12, 2006, 8 pages.

Hiromitsu Kato et al. "Improvement of (001)-Oriented Diamond p-i-n Diode by Use of Selective Grown n⁺ Layer", Physica Status Solidi A, vol. 207, No. 9, 2010, 6 pages.

* cited by examiner

SEMICONDUCTOR DEVICE

CROSS-REFERENCE TO RELATED APPLICATIONS

This application is based upon and claims the benefit of priority from Japanese Patent Application No. 2014-253215, filed on Dec. 15, 2014; the entire contents of which are incorporated herein by reference.

FIELD

Embodiments described herein relate generally to a semiconductor device.

BACKGROUND

Semiconductor devices using diamond have been proposed. It is desirable to reduce the on voltage of such semiconductor devices.

DETAILED DESCRIPTION

Figure 1:
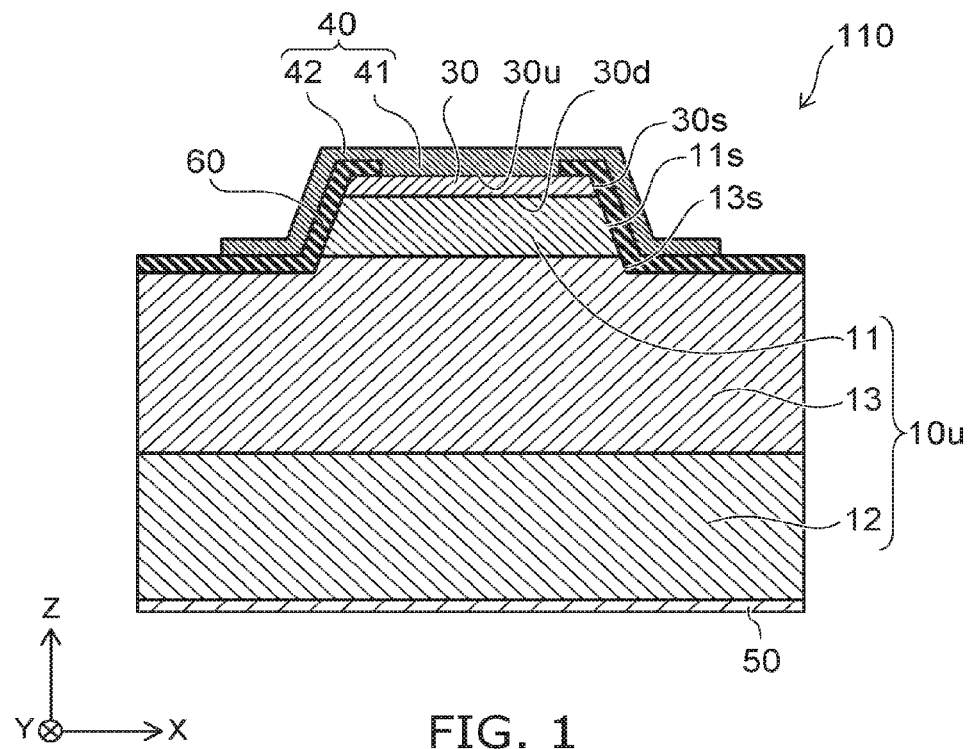
FIG. 1 is a schematic cross-sectional view illustrating a semiconductor device according to a first embodiment.

According to one embodiment, a semiconductor device includes an n-type semiconductor layer, a first electrode, and a nitride semiconductor layer. The n-type semiconductor layer includes diamond. The nitride semiconductor layer is provided between the n-type semiconductor layer and the first electrode.

The nitride semiconductor layer includes $Al_xGa_{1-x}N$ ($0 \le x \le 1$) and is of n-type.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

(First Embodiment)

Figure 2:
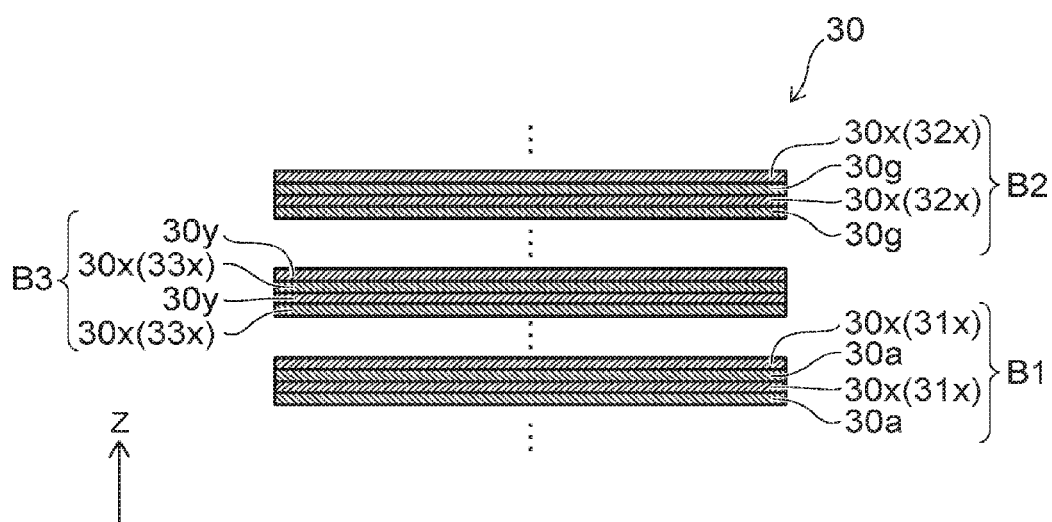
FIG. 2 is a schematic cross-sectional view illustrating the semiconductor device according to the first embodiment.

FIGS. 1 and 2 are schematic cross-sectional views illustrating a semiconductor device according to a first embodiment.

As illustrated in FIG. 1, a semiconductor device 110 includes an n-type semiconductor layer 11, a first electrode 40, and a nitride semiconductor layer 30. In this example, the semiconductor device 110 further includes a second electrode 50, a p-type semiconductor layer 12, an intermediate semiconductor layer 13, and an insulating layer 60.

The semiconductor device 110 is a pin diode using diamond as a semiconductor layer.

The direction from the n-type semiconductor layer 11 toward the first electrode 40 is defined as a stacking direction (Z-axis direction). One direction perpendicular to the Z-axis direction is defined as an "X axis direction". The direction perpendicular to the
Z-axis direction and perpendicular to the X-axis direction is defined as a "Y-axis direction". An X-Y plane is the plane perpendicular to the stacking direction (Z-axis direction).

The p-type semiconductor layer 12 (first p-type semiconductor layer) is a semiconductor layer that includes diamond. For example, a diamond substrate doped with boron (B) is used as an acceptor for the p-type semiconductor layer 12. The p-type semiconductor layer 12 is a $p^+$ layer. The B concentration in the p-type semiconductor layer 12 is, for example, not less than $1 \times 10^{20}$ cm$^{-3}$ and not more than $1 \times 10^{21}$ cm$^{-3}$. The thickness of the p-type semiconductor layer 12 (length along the Z axis direction) is, for example, not less than 50 micrometers (μm) and not more than 500 μm.

The n-type semiconductor layer 11 is provided on the p-type semiconductor layer 12, with the intermediate semiconductor layer 13 disposed therebetween. The n-type semiconductor layer 11 is a semiconductor layer that includes diamond. For example, the n-type semiconductor layer 11 is doped with phosphorus (P) as a donor. The n-type semiconductor layer 11 is an $n^+$ layer. The P concentration in the n-type semiconductor layer 11 is, for example, not less than $5 \times 10^{19}$ cm$^{-3}$ and not more than $5 \times 10^{20}$ cm$^{-3}$. The thickness of the n-type semiconductor layer is, for example, not less than 100 nanometers (nm) and not more than 2,000 nm.

The n-type semiconductor layer 11 is electrically connected to the p-type semiconductor layer 12. In this specification, the state of being electrically connected includes both the state of direct contact and the state in which there is a separate layer inserted therebetween. The state of being electrically connected includes states in which it is possible to form a state in which current flows in at least one direction.

The intermediate semiconductor layer 13 is provided between the n-type semiconductor layer 11 and the p-type semiconductor layer 12. The intermediate semiconductor layer 13 includes diamond, and is, for example, a $p^-$ layer. The impurity concentration (donor concentration or acceptor concentration) in the intermediate semiconductor layer 13 is lower than the impurity concentration in the p-type semiconductor layer 12. The impurity concentration in the intermediate semiconductor layer 13 is lower than the impurity concentration in the n-type semiconductor layer 11. The intermediate semiconductor layer 13 may be, for example, an intrinsic semiconductor. The thickness of the intermediate semiconductor layer 13 is, for example, not less than 1 μm and not more than 200 μm.

These semiconductor layers are included in a stacked body 10u that includes a pn junction. In this embodiment, pn junction includes a stacked body of a p-type layer and an n-type layer. In this embodiment, a pn junction is included in a stacked body, even when a low impurity concentration layer is provided between the p-type layer and the n-type layer.

The nitride semiconductor layer 30 is provided on the n-type semiconductor layer 11. The bottom face 30d (first face) of the nitride semiconductor layer 30 is in contact with the n-type semiconductor layer 11. The nitride semiconductor layer 30 has a top face 30u (second face) that is separated from the bottom face 30d and that is in contact with the first electrode 40 in the Z-axis direction.

The nitride semiconductor layer 30 includes, for example, $Al_xGa_{1-x}M$ (0≤x≤1). For example, the nitride semiconductor layer 30 is an n-type semiconductor, and the nitride semiconductor layer 30 is doped with silicon (Si) as a donor. The Si concentration in the nitride semiconductor layer 30 is not less than $5\times10^{18}$ cm$^{-3}$ and not more than $5\times10^{19}$ cm$^{-3}$. The thickness of the nitride semiconductor layer 30 is, for example, not less than 10 nm and not more than 500 nm.

The nitride semiconductor layer 30 may have a superlattice structure. The superlattice structure has a structure with a plurality of layers stacked along the stacking direction (the direction from the n-type semiconductor layer 11 toward the first electrode 40) (see FIG. 2).

For example, the nitride semiconductor layer 30 includes at least any of a first structural body B1, a second structural body B2, and a third structural body B3. The first structural body B1 includes a plurality of $Al_xGa_{1-x}N$ (0≤x<1) layers 30x ($Al_{x1}Ga_{1-x1}N$ (0≤x1<1) layers 31x) and a plurality of AlN layers 30a arranged alternately in the stacking direction. The second structural body B2 includes a plurality of $Al_xGa_{1-x}N$ (0<x≤1) layers 30x ($Al_{x2}Ga_{1-x2}N$ (0<x2≤1) layers 32x) and a plurality of GaN layers 30g arranged alternately in the stacking direction. The third structural body B3 includes a plurality of $Al_xGa_{1-x}N$ (0<x≤1) layers 30x ($Al_{x3}Ga_{1-x3}N$ (0<x3≤1) layers 33x) and a plurality of $Al_yGa_{1-y}N$ (0≤y<x) layers 30y arranged alternately in the stacking direction. In this embodiment, the Al composition ratio (mixed crystal ratio) x and the Al composition ratio y may vary along the stacking direction.

The stacked body that includes the stacked body 10u and the nitride semiconductor layer 30 has a mesa structure.

In other words, the nitride semiconductor layer 30 has a first side face 30s, the n-type semiconductor layer 11 has a second side face 11s, and the intermediate semiconductor layer 13 has a third side face 13s. These side faces intersect the X-Y plane. The second side face 11s is continuous with the first side face 30s, and the third side face 13s is continuous with the second side face 11s. For example, the second side face 11s and the third side face 13s are along a plane that includes the first side face 30s.

The insulating layer 60 is provided covering these side faces. In other words, the insulating layer 60 is in contact with the first side face 30s, the second side face 11s, and the third side face 13s. In addition, the insulating layer 60 is in contact with a portion (end portion) of the top face 30u of the nitride semiconductor layer 30, and with the top face of the intermediate semiconductor layer 13. For the insulating layer 60, silicon oxide may, for example, be used. The insulating layer 60 functions as, for example, a protective layer. By covering the side faces of the stacked body with the insulating layer 60, the reliability is increased. Note that the insulating layer 60 may be omitted.

The first electrode 40 is provided on the nitride semiconductor layer 30, and, on the insulating layer 60. The first electrode 40 is an ohmic electrode. At least any of titanium (Ti), platinum (Pt), gold (Au), molybdenum (Mo), tantalum (Ta), zirconium (Zr), and hafnium (Hf) can be used as the material of the first electrode 40.

As illustrated in FIG. 1, the first electrode 40 includes a first portion 41. The first portion 41 is provided on the nitride semiconductor layer 30, and is a portion that contacts a portion of the top face 30u, and is a contact portion of the n-type semiconductor layer 11.

The first electrode 40 further includes a second portion 42 that is continuous with the first portion 41. The second portion 42 is a portion provided on the insulating layer 60, and when projected onto the X-Y plane, is provided around the first portion 41. The insulating layer 60 includes portions disposed at a first position between the second portion 42 and the top face 30u, a second position between the second portion 42 and the first side face 30s, and a third position between the second portion 42 and the second side face 11s. The second portion 42 includes a pad portion provided around the contact portion. The second portion 42 may be omitted.

The second electrode 50 is electrically connected to the p-type semiconductor layer 12. In this example, the p-type semiconductor layer 12 is disposed between the second electrode 50 and the n-type semiconductor layer 11. At least any of titanium (Ti), platinum (Pt), gold (Au), molybdenum (Mo), tantalum (Ta), zirconium (Zr), and hafnium (Hf) can be used as the material of the second electrode 50.

The impurity concentration of each layer can be measured using secondary ion mass spectrometry (SIMS). In this example, the B concentration in the p-type semiconductor layer 12 is $5\times10^{20}$ cm$^{-3}$, and the P concentration in the n-type semiconductor layer 11 is $1\times10^{20}$ cm$^{-3}$. The Si concentration in the nitride semiconductor layer 30 is $1\times10^{19}$ cm$^{-3}$. The concentration of impurities (B or P) in the intermediate semiconductor layer 13 is, for example, less than $1\times10^{15}$ cm$^{-3}$, which is lower than the detection limit for SIMS.

The following is a description of an example of a manufacturing method of the semiconductor device 110.

FIG. 3A to FIG. 3E are procedural schematic cross-sectional views illustrating a manufacturing method of the semiconductor device according to the first embodiment.

Figure 3A:
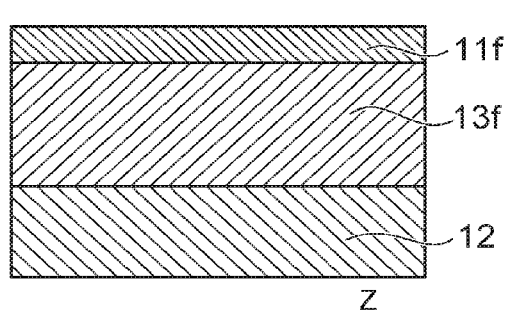
FIG. 3A to FIG. 3E are procedural schematic cross-sectional views illustrating a manufacturing method of the semiconductor device according to the first embodiment.

As illustrated in FIG. 3A, an undoped intrinsic semiconductor diamond layer 13f that forms the intermediate semiconductor layer 13 is formed on the p-type semiconductor layer 12 (B doped p-type diamond substrate), and a P doped n-type diamond layer 11f that forms the n-type semiconductor layer 11 is formed thereupon by epitaxial growth. For example, the microwave plasma chemical vapor deposition (CVD) method can be used for forming these layers.

Figure 3B:
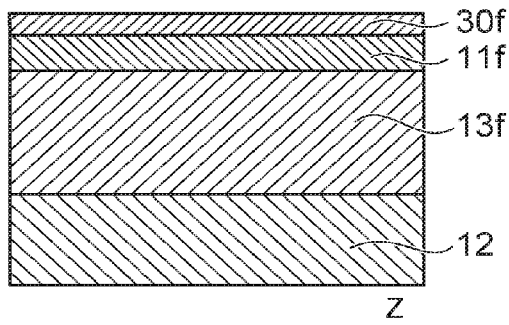

As illustrated in FIG. 3B, an Si doped n-type AlGaN layer 30f that forms the nitride semiconductor layer 30 is formed by epitaxial growth on the P doped n-type diamond layer 11f. By using Si as the n-type dopant, the $Al_xGa_{1-x}N$ (0≤x≤1) can be made n-type comparatively easily.

For example, the metal organic chemical vapor deposition (MOCVD) method can be used for growing the Si doped n-type AlGaN layer 30f. Single crystals or multicrystals of $Al_xGa_{1-x}N$ (0≤x≤1) can be grown on diamond comparatively easily by the MOCVD method, the molecular beam epitaxy (MBE) method, and the like.

Figure 3C:
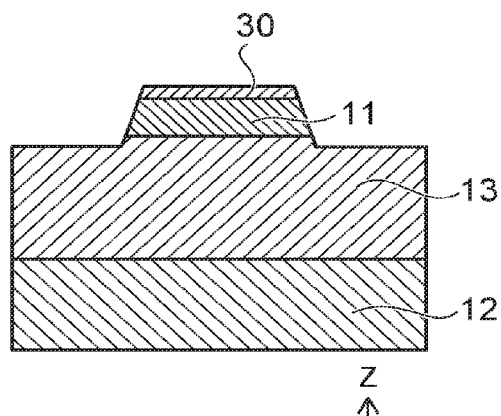

As illustrated in FIG. 3C, a portion of the undoped intrinsic semiconductor diamond layer 13f, a portion of the P doped n-type diamond layer 11f, and a portion of the Si doped n-type AlGaN layer 30f are removed to form a mesa structure. For example, patterning and reactive ion etching (RIE) can be used for removing these portions. Thereby, the intermediate semiconductor layer 13, the n-type semiconductor layer 11, and the nitride semiconductor layer 30 are formed.

Figure 3D:
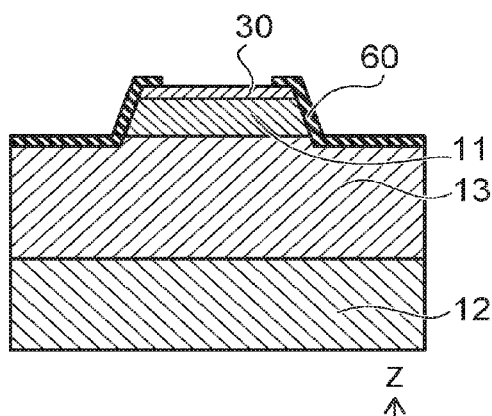

The insulating layer 60 is formed as illustrated in FIG. 3D. For example, a silicon oxide layer that forms the insulating layer 60 is formed by the CVD method or the like. A portion of the silicon oxide film corresponding to the portion in contact with the first electrode 40 is removed by patterning and etching. Thereby, the insulating layer 60 is formed.

Figure 3E:
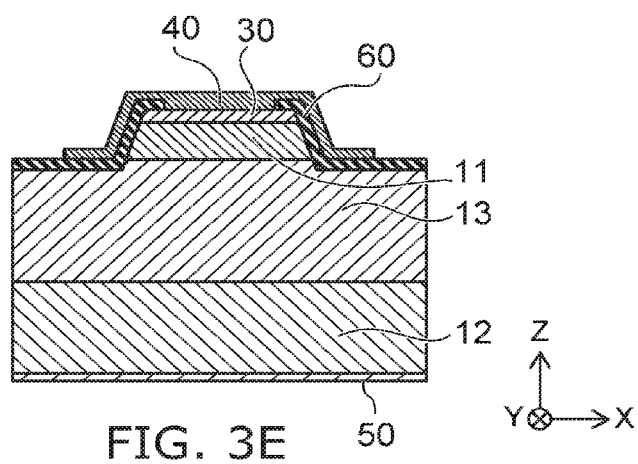

As illustrated in FIG. 3E, a conductive film that forms the first electrode 40 is formed on the exposed nitride semiconductor layer 30 and on the insulating layer 60. In this example, a stacked film of Ti/Pt/Au is used in the conductive film. Electron beam vapor deposition is used for forming the conductive film. Then, the conductive film is patterned. Thereby, the first electrode 40 is formed.

The second electrode 50 is formed on the bottom face of the p-type semiconductor layer 12 by, for example, electron beam vapor deposition. In this example, a stacked film of Ti/Pt/Au is used in the second electrode 50.

Then, annealing is carried out. The annealing temperature is, for example, not less than 500° C. and not more than 700° C., and in this example, is 600° C. The annealing time is not less than 10 minutes and not more than 60 minutes, and in this example, is 30 minutes.

As a result of the above processes, the semiconductor device 110 is formed. A p-type layer may be grown on the substrate (p-type semiconductor layer 12) as the intermediate semiconductor layer 13, and a low concentration B doped p⁻ layer may also be used.

As described above, in the semiconductor device 110 according to the embodiment, the nitride semiconductor layer 30 is provided between the first electrode 40 and the n-type semiconductor layer 11. Also, the n-type semiconductor layer 11 is positioned between the p-type semiconductor layer 12 and the first electrode 40, and the intermediate semiconductor layer 13 is positioned between the n-type semiconductor layer 11 and the p-type semiconductor layer 12. A current flows between the first electrode 40 (first portion 41) and the n-type semiconductor layer 11 via the nitride semiconductor layer 30. A current flows between the first electrode 40 and the second electrode 50 via the stacked body 10u and the nitride semiconductor layer 30 that form a pn junction. The direction that the current flows in the nitride semiconductor layer 30 is, for example, a direction along the stacking direction.

Figure 4:
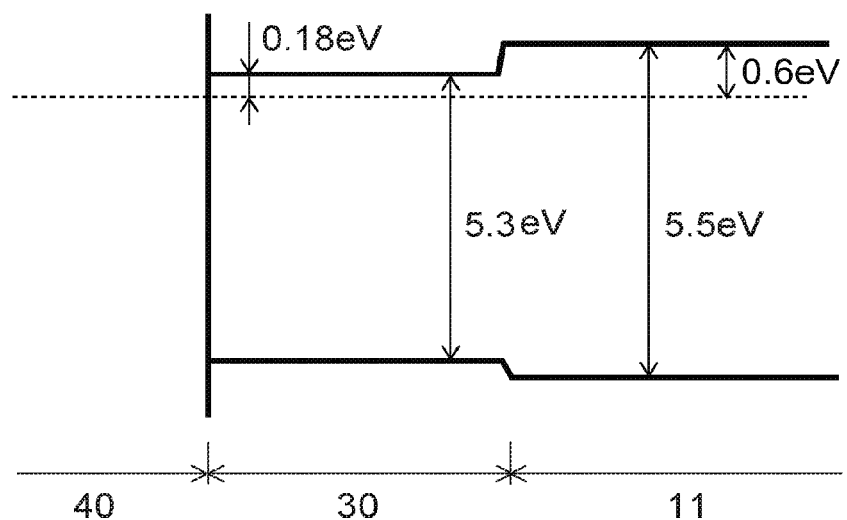
FIG. 4 is a schematic view illustrating the characteristics of the semiconductor device according to the first embodiment.

FIG. 4 is a schematic view illustrating the characteristics of the semiconductor device according to the first embodiment.

FIG. 4 schematically illustrates the band state in a thermal equilibrium state of the n-type semiconductor layer 11, the nitride semiconductor layer 30, and the first electrode 40.

As illustrated in FIG. 4, the band gap in the n-type semiconductor layer 11 that includes diamond is about 5.5 eV. The activation energy of the P donor in the diamond is about 0.6 eV.

The band gap of the $Al_xGa_{1-x}N$ ($0 \le x \le 1$) used in the nitride semiconductor layer 30 is varied from about 3.4 eV to about 6.3 eV by the Al composition ratio (x).

In GaN when x=0, the activation energy of the Si donor is from 10 to 100 meV. The activation energy of the Si donor increases as x increases. For example, in AlN when x=1, the activation energy of the Si donor is from about 200 to 300 meV. In this way, the activation energy of the Si donor in the AlGaN is not more than about half the activation energy of the P donor in the diamond.

In this example, the Al composition ratio x of the $Al_xGa_{1-x}N$ ($0 \le x \le 1$) is, for example, not less than 0.7 and not more than 0.9. For example, when x=0.8, the band gap in the nitride semiconductor layer 30 is about 5.3 eV. Also, the activation energy of the Si donor in the nitride semiconductor layer 30 is about 180 meV. Therefore, as illustrated in FIG. 4, the barrier between the diamond (n-type semiconductor layer 11) and the first electrode 40 is comparatively low.

In the current-voltage characteristic (I-V characteristic) of the semiconductor device 110, the rectification ratio at ±10 V is, for example, not less than $1 \times 10^{10}$. The forward direction current density at 5 V is, for example, not less than 1,000 A/cm². Breakdown does not occur even when the voltage in the reverse direction is 10 kV. According to this embodiment, a semiconductor device having a high withstand voltage, and a low on voltage (the threshold voltage to switch the semiconductor device from the OFF state to the ON state) is provided.

Diamond is strong and has a high thermal conductivity (about 20 W/cmK). The band gap energy in diamond is about 5.5 eV, so diamond is a wide gap semiconductor.

The carriers in diamond have high mobility. For example, the electron mobility is about 4,500 cm²/Vsec, and the hole mobility is about 3,800 cm²/Vsec.

The breakdown field strength of diamond is high, and is expected to be 10 MV/cm. It is expected that diamond can be applied to power devices that can operate at high temperatures, high frequency (power) devices, ultraviolet light devices, electron emission sources, and the like. As can be seen from a comparison of power device performance indices (Baliga indices), diamond is expected to greatly improve the performance of power devices compared with SiC and GaN.

To date, diodes and transistors having a schottky junction using diamond have been investigated. However, the limiting withstand voltage is restricted by the height of the schottky barrier. Therefore, it is difficult to obtain a withstand voltage of not less than 10 kV.

On the other hand, in pin diodes having a bipolar conduction mechanism, the withstand voltage in the reverse direction is determined by the pn junction boundary depletion layer (in other words, the i layer). Therefore, it is possible to utilize the inherent high insulation breakdown electric field of diamond.

For forward direction current also, it is possible to obtain extremely high mobility in a diamond intrinsic layer (i layer), so high conductivity can be expected even when the i layer or drift layer is thick.

High concentration doping can be carried out on a diamond n-type layer, and thereby, it is possible to form a bipolar device. However, in n-type diamond, the Fermi level is strongly pinned by the surface level. The strength of pinning of the Fermi level on the surface of diamond depends on the atomic arrangement on the surface of diamond. For example, when the surface of the diamond is terminated by oxygen (O) or an OH group, the pinning is strong. Therefore, it is difficult to form an ohmic junction even if the type of metal that forms the electrode is selected. Therefore, the rising characteristic of the forward direction current of the diode is poor, and the on voltage and on resistance increase. In particular, in a device with a thick drift layer with the purpose of a high withstand voltage, the injection of carriers is insufficient, and the on voltage and on resistance may be increased. In unipolar devices such as schottky diodes using an n-type layer, the contact resistance of the n-type layer is high, so the on voltage may be high. For example, methods that can be considered include the method of forming an electrode by doping the surface of diamond with a high concentration of n-type dopant, depositing Ti thereupon, and annealing at a temperature of not less than 600° C.; the method of forming the electrode by providing a metal layer on the diamond with a graphite layer therebetween; the method of forming the electrode by depositing a metal layer of Ti, Mo, Ta, Zr, Hf, or the like on the diamond and annealing at not less than 400° C.; and the method of forming the electrode by depositing metal on the surface of diamond terminated by hydrogen. However, with these methods, the Fermi level is strongly pinned depending on the atomic arrangement at the diamond surface, so it is difficult to sufficiently reduce the contact resistance.

In addition, there is also the method of forming the electrode by implanting ions such as Ga onto the diamond surface and providing a metal layer thereupon. With this method, the crystallinity of the surface of the diamond is reduced by the ion implantation, which relieves the pinning of the Fermi level. Thereby, the energy barrier between the metal layer and the diamond is reduced, and an ohmic junction is formed. However, with this method, defects are introduced into the surface of the diamond by the ion implantation, so the withstand voltage of the semiconductor device is reduced.

In contrast, in this embodiment, the nitride semiconductor layer 30 is provided between the n-type semiconductor layer 11 that includes diamond and the first electrode 40. The nitride semiconductor layer 30 is formed by epitaxial growth on the diamond, so the atomic arrangement on the outermost surface of the diamond is changed. Thereby, the pinning of the Fermi level produced by the boundary between the diamond and the electrode is relieved. In other words, as described in FIG. 4, it is possible to lower the barrier between the diamond (n-type semiconductor layer 11) and the first electrode 40. Thereby, it is possible to reduce the contact resistance.

Also, as stated previously, the n-type diamond layer (n-type semiconductor layer 11) is formed by epitaxial growth. In addition, the AlGaN layer (nitride semiconductor layer 30) is formed on the n-type diamond by epitaxial growth. Therefore, the number of defects in the n-type semiconductor layer 11 and the nitride semiconductor layer 30 is small, and the crystallinity is high. Thereby, it is possible to obtain a high withstand voltage.

When the nitride semiconductor layer 30 has the superlattice structure as described previously, it is possible to reduce the strain due to the difference in the lattice constant of the n-type diamond layer that forms the substrate and the lattice constant of the AlGaN when forming the nitride semiconductor layer 30. Thereby, it is possible to obtain a nitride semiconductor layer 30 with fewer defects and higher crystallinity.

When the lattice of the $Al_xGa_{1-x}N$ (0≤x≤1) has an Al composition ratio of about 0.8, it easily conforms to the lattice of the n-type diamond layer. In this embodiment, by making x=about 0.8, it is possible to increase the crystallinity of the n-type semiconductor layer 11 and the nitride semiconductor layer 30, and obtain a high withstand voltage.

By using Ti or the like in the first electrode 40, a good ohmic junction is formed between the first electrode 40 and the nitride semiconductor layer 30. In addition, at around room temperature, the resistivity of AlGaN is low compared with the resistivity of diamond, and the thickness of the nitride semiconductor layer 30 is comparatively thin of about 100 nm. Thereby, it is possible to further improve the contact properties.

When a bias in the reverse direction is applied to the pn junction, the diamond becomes depleted. Thereby, it is possible to reduce the electric field and increase the withstand voltage as far as the edge of the electrode.

As described above, in this embodiment, the nitride semiconductor layer 30 is provided between the n-type semiconductor layer 11 that includes diamond and the first electrode 40. Thereby, pinning of the Fermi level at the surface of the diamond is relieved, the n-side barrier is reduced, and the contact properties can be improved. According to this embodiment, it is possible to reduce the contact resistance and improve the on voltage and on resistance in a semiconductor device having high withstand voltage.

(Second Embodiment)

Figure 5:
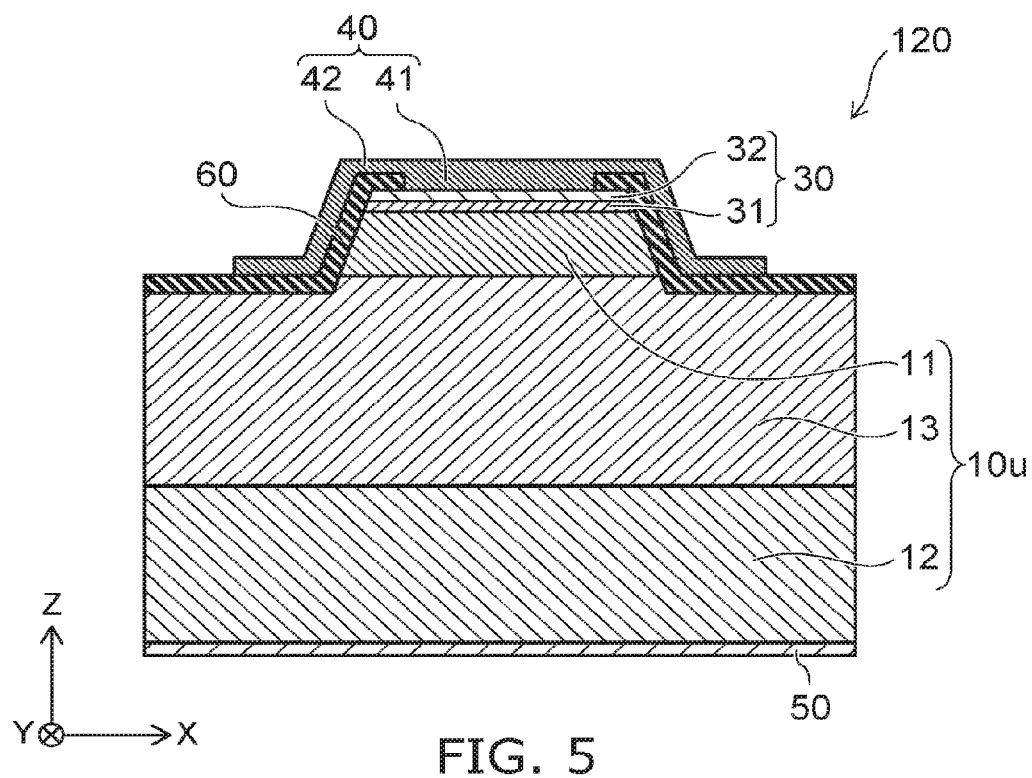
FIG. 5 is a schematic cross-sectional view illustrating a semiconductor device according to a second embodiment.
Figure 6:
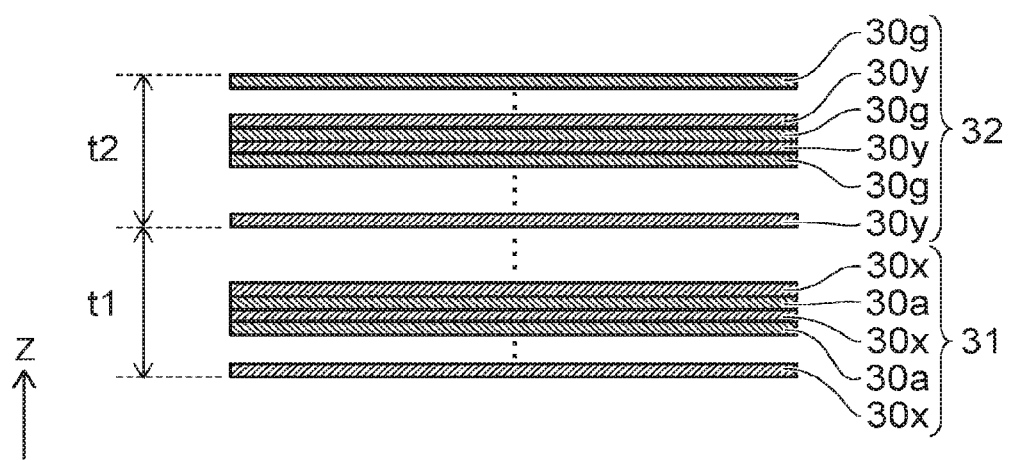
FIG. 6 is a schematic cross-sectional view illustrating the semiconductor device according to the second embodiment.

FIGS. 5 and 6 are schematic cross-sectional views illustrating a semiconductor device according to a second embodiment. In a semiconductor device 120 illustrated in FIG. 5, the nitride semiconductor layer 30 includes a first region 31 and a second region 32. Apart from this, the description of the semiconductor device 110 can be applied to the description of the semiconductor device 120.

The first region 31 is provided in contact with the n-type semiconductor layer 11. The first region 31 includes $Al_xGa_{1-x}N$ (0<x≤1). The Al composition ratio is, for example, not less than 0.7 and not more than 0.9. The thickness of the first region 31 is, for example, not less than 20 nm and not more than 200 nm.

The first region 31 has a superlattice structure. For example, the first region 31 includes a plurality of AlN layers 30a and a plurality of $Al_xGa_{1-x}N$ (0<x≤1) layers 30x, arranged alternately in the stacking direction (see FIG. 6). In this case, the average Al composition ratio in the first region 31 is, for example, not less than 0.7 and not more than 0.9.

The second region 32 is provided on the first region 31. In other words, the first region 31 is provided between the second region 32 and the n-type semiconductor layer 11. For example, the second region 32 is in contact with the first electrode 40. The second region 32 includes $Al_yGa_{1-y}N$ (0≤y<x). The Al composition ratio y is, for example, not less than 0.4 and not more than 0.6. The thickness of the second region 32 is, for example, not less than 20 nm and not more than 200 nm.

The second region 32 may have a superlattice structure. For example, the second region 32 includes a plurality of GaN layers and a plurality of $Al_yGa_{1-y}N$ (0≤y<x) layers, arranged alternately in the stacking direction. In this case, the average Al composition ratio in the second region 32 is, for example, not less than 0.4 and not more than 0.6.

The average Al composition ratio is as follows, for example. Assume that the thickness of the first region 31 is t1 nanometers, the thickness of the second region 32 is t2 nanometers, the total thickness of the plurality of AlN layers is ta nanometers, the total thickness of the plurality of $Al_xGa_{1-x}N$ (0<x≤1) layers is tx nanometers, and the total thickness of the plurality of $Al_yGa_{1-y}N$ (0≤y<x) layers is ty nanometers. Then, the average Al composition ratio in the first region 31 is represented by $(ta+x \times tx)/t1$. The average Al composition ratio of the second region 31 is represented by $(y \times ty)/t2$.

Note that in this embodiment, the Al composition ratio x and the Al composition ratio y may vary along the stacking direction.

The impurity concentration of each layer can be measured by SIMS. For example, the B concentration in the p-type semiconductor layer 12 is $5 \times 10^{20}$ cm$^{-3}$. The P concentration in the n-type semiconductor layer 11 is $1 \times 10^{20}$ cm$^{-3}$. The Si concentration in both the first region 31 and the second region 31 is $1 \times 10^{19}$ cm$^{-3}$. The concentration of impurities (B or P) in the intermediate semiconductor layer 13 is, for example, less than $1 \times 10^{15}$ cm$^{-3}$, which is lower than the detection limit for SIMS.

Next, an example of a manufacturing method of the semiconductor device 120 is described.

FIG. 7A to FIG. 7E are procedural schematic cross-sectional views illustrating a manufacturing method of the semiconductor device according to the second embodiment.

Figure 7A:
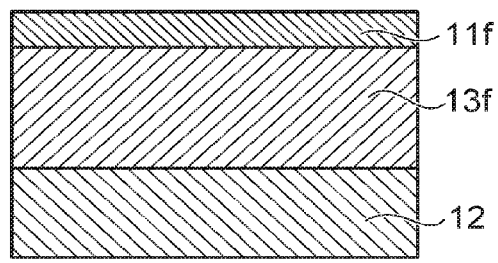
FIG. 7A to FIG. 7E are procedural schematic cross-sectional views illustrating a manufacturing method of the semiconductor device according to the second embodiment.

As illustrated in FIG. 7A, an undoped intrinsic semiconductor diamond layer 13f that forms the intermediate semiconductor layer 13 is formed on the p-type semiconductor layer 12 (B doped p-type diamond substrate), and a P doped n-type diamond layer 11f that forms the n-type semiconductor layer 11 is formed thereupon by epitaxial growth. For example, the microwave plasma CVD method is used for forming these layers.

Figure 7B:
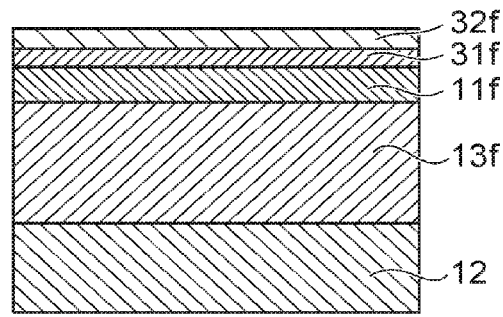

As illustrated in FIG. 7B, an n-type AlN/AlGaN superlattice layer 31f that forms the first region 31 is formed by epitaxial growth on the P doped n-type diamond layer 11f, using, for example, the MOCVD method. Here, the composition of the AlGaN, the thickness of the AlGaN, and the thickness of the AlN are set so that the average Al composition ratio in the first region 31 is 0.8.

An n-type GaN/AlGaN superlattice layer 32f that forms the second region 32 is formed on the n-type AlN/AlGaN superlattice layer 31f by epitaxial growth using, for example, the MOCVD method. Here, the composition of the AlGaN, the thickness of the AlGaN, and the thickness of the GaN are set so that the average Al composition ratio in the second region 32 is 0.5.

Figure 7C:
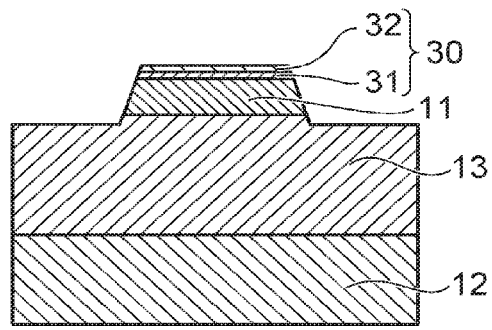

As illustrated in FIG. 7C, using patterning and RIE, a mesa structure is formed down to part way into the undoped intrinsic semiconductor diamond layer 13f.

Figure 7D:
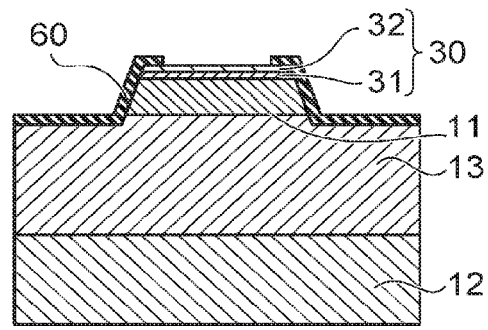

As illustrated in FIG. 7D, the insulating layer 60 is formed on the second region 32 and on the mesa side faces. For example, a silicon oxide film that forms the insulating layer 60 is formed by the CVD method or the like. Thereafter, using patterning and RIE, a portion of the silicon oxide film corresponding to the portion in contact with the first electrode 40 is removed.

Figure 7E:
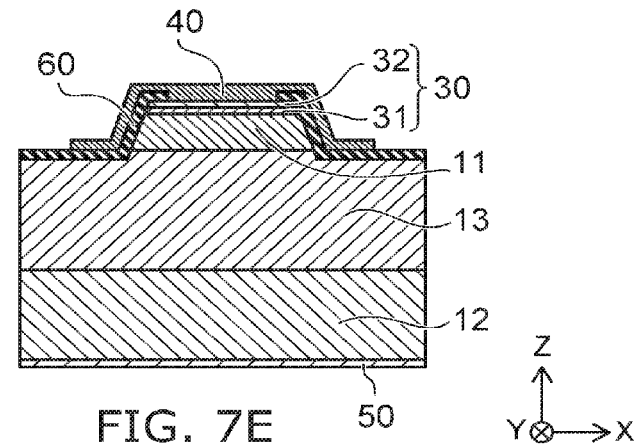

As illustrated in FIG. 7E, the conductive film that forms the first electrode 40 is formed on the exposed second region 32 and on the insulating layer 60. In addition, a conductive film that forms the second electrode 50 is formed on the bottom face of the p-type semiconductor layer 12. Here, a stacked film of Ti/Pt/Au is used as these conductive films. Electron beam vapor deposition is used for forming the conductive film.

Then, annealing is carried out. The annealing temperature is, for example, not less than 500° C. and not more than 700° C., and in this example, is 600° C. The annealing time is not less than 10 minutes and not more than 60 minutes, and in this example, is 30 minutes.

As a result of the above processes, the semiconductor device 120 is formed. In this embodiment, the undoped intrinsic semiconductor diamond layer 13f is formed directly on top of the p-type semiconductor layer 12. However, a p-type layer may be formed on the p-type semiconductor layer 12, and the undoped intrinsic semiconductor diamond layer 13f may be formed thereupon. Instead of the undoped intrinsic semiconductor diamond layer 13f, a low concentration B doped p$^-$ layer may be used.

In the current-voltage characteristic (I-V characteristic) of the semiconductor device 120, the rectification ratio at ±10 V is, for example, not less than $1 \times 10^{10}$. The forward direction current density at 5 V is, for example, not less than 1,000 A/cm$^2$. Breakdown does not occur even when the voltage in the reverse direction is 10 kV. In the semiconductor device 120, a high withstand voltage and low on voltage can be obtained, the same as for the semiconductor device 110.

As stated previously, the band gap of AlGaN varies depending on the Al composition ratio. The smaller the Al composition ratio of the AlGaN, the narrower the band gap, and it is possible to increase the carrier density. Therefore, on the first electrode 40 side of the nitride semiconductor layer 30, preferably, AlGaN with a lower Al composition ratio is used. On the other hand, if the band discontinuity between the nitride semiconductor layer 30 and the n-type semiconductor layer 11 is large, the flow of carriers is obstructed. Therefore, along the stacking direction from the n-type semiconductor layer 11 toward the first electrode 40, it is possible to achieve better contact by reducing the Al composition ratio in steps.

In the semiconductor device 120, the average Al composition ratio in the first region 31 is, for example, 0.8. Thereby, band discontinuity between the nitride semiconductor layer 30 and the n-type semiconductor layer 11 is suppressed. Also, the average Al composition ratio in the second region 32 is lower than the average Al composition ratio in the first region 31, for example, 0.5. Thereby, it is possible to increase the carrier density in the first region 31, and reduce the contact resistance.

(Third Embodiment)

Figure 8:
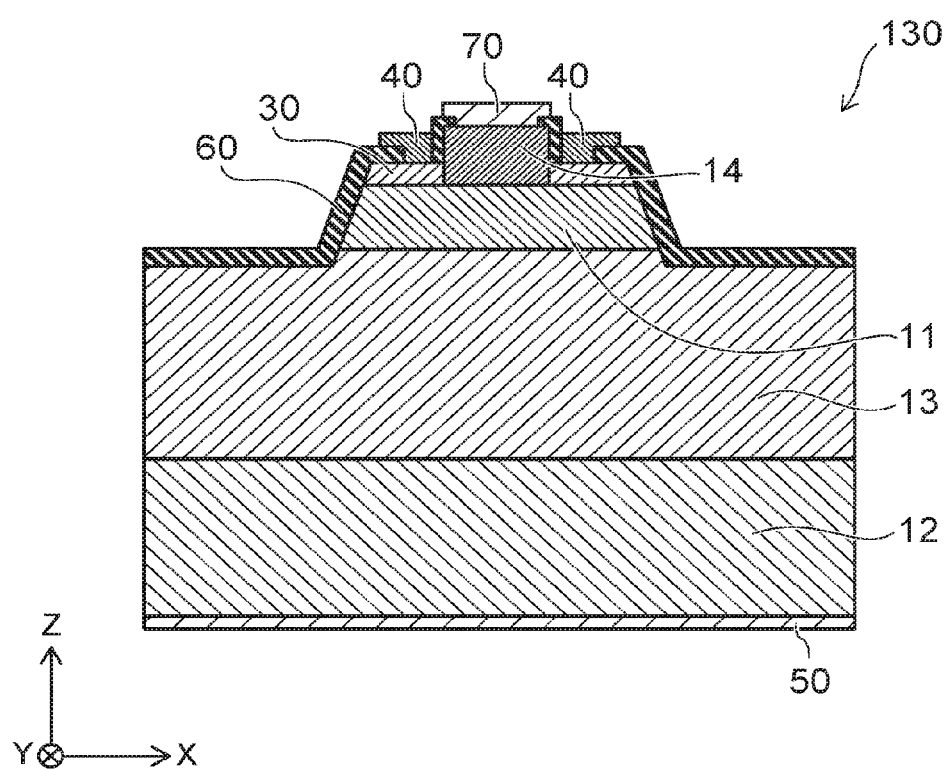
FIG. 8 is a schematic cross-sectional view illustrating a semiconductor device according to a third embodiment.

FIG. 8 is schematic cross-sectional view illustrating an example of the semiconductor device according to the third embodiment.

As illustrated in FIG. 8, a semiconductor device 130 according to this embodiment includes the p-type semiconductor layer 12, the intermediate semiconductor layer 13, the n-type semiconductor layer 11, the nitride semiconductor layer 30, the first electrode 40, and the insulating layer 60. The same description as that in the first embodiment can be applied to describe these. The semiconductor device 130 further includes a second p-type semiconductor layer 14 and a third electrode 70. The semiconductor device 130 is a bipolar junction transistor (BJT) using diamond as a semiconductor layer.

The second p-type semiconductor layer 14 is provided on the n-type semiconductor layer 11. The second p-type semiconductor layer 14 has a portion that aligns with the nitride semiconductor layer 30 in a direction that intersects with the Z-axis direction (for example, the X-axis direction or the Y-axis direction).

For example, when projected on the X-Y plane, the second p-type semiconductor layer 14 is surrounded by the nitride semiconductor layer 30. The n-type semiconductor layer 11 includes a portion provided between the second p-type semiconductor layer 14 and the intermediate semiconductor layer 13, and a portion provided between the nitride semiconductor layer 30 and the intermediate semiconductor layer 13.

In addition, the second p-type semiconductor layer 14 has a portion that aligns with the first electrode 40 in a direction that intersects with the Z-axis direction. For example, when projected on the X-Y plane, the second p-type semiconductor layer 14 is surrounded by the first electrode 40.

The second p-type semiconductor layer 14 includes diamond. For example, B doped diamond is used in the second p-type semiconductor layer 14. The B concentration in the second p-type semiconductor layer 14 is, for example, not less than $1 \times 10^{20}$ cm$^{-3}$, and not more than $1 \times 10^{21}$ cm$^{-3}$. The thickness of the second p-type semiconductor layer 14 is, for example, not less than 100 nm and not more than 1000 nm.

The third electrode 70 is provided on the second p-type semiconductor layer 14, and is electrically connected to the second p-type semiconductor layer 14.

The insulating layer 60 includes a portion provided between the first electrode 40 and the third electrode 70, and, a portion provided between the first electrode 40 and the second p-type semiconductor layer 14.

For example, the first electrode 40 corresponds to a transistor base terminal, the second electrode 50 corresponds to a collector terminal, and the third electrode 70 corresponds to an emitter terminal.

FIG. 9A to FIG. 9F are procedural schematic cross-sectional views illustrating a manufacturing method of the semiconductor device according to the third embodiment.

Figure 9A:
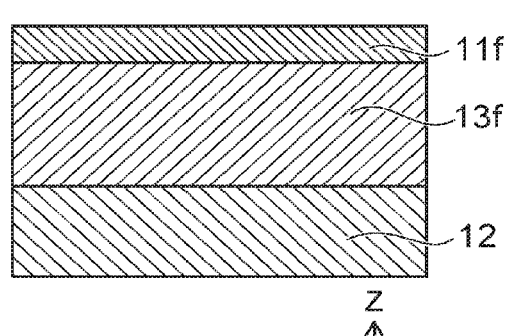
FIG. 9A to FIG. 9F are procedural schematic cross-sectional views illustrating a manufacturing method of the semiconductor device according to the third embodiment.

As illustrated in FIG. 9A, the undoped intrinsic semiconductor diamond layer 13f that forms the intermediate semiconductor layer 13 is formed on the p-type semiconductor layer 12 (B doped p-type diamond substrate), and the P doped n-type diamond layer 11f that forms the n-type semiconductor layer 11 is formed thereupon by epitaxial growth. For example, the microwave plasma CVD method is used for forming these layers.

Figure 9B:
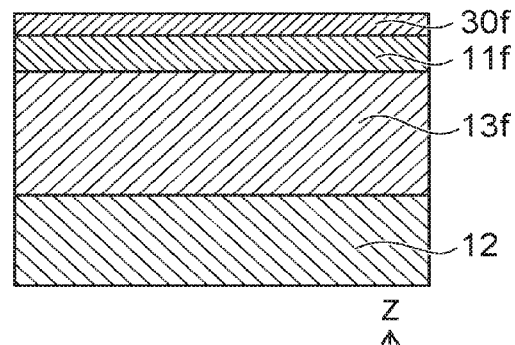

As illustrated in FIG. 9B, the Si doped n-type AlGaN layer 30f that forms the nitride semiconductor layer 30 is formed by epitaxial growth on the P doped n-type diamond layer 11f. For example, the MOCVD method is used for growing the Si doped n-type AlGaN layer 30f.

Figure 9C:
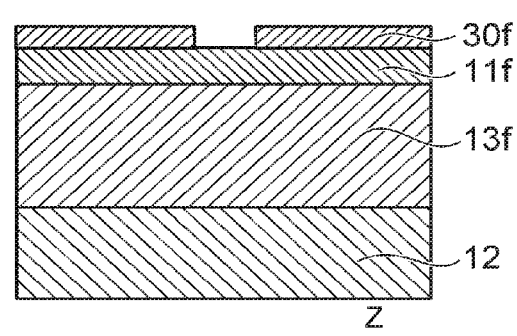

As illustrated in FIG. 9C, a portion of the Si doped n-type AlGaN layer 30f is removed by patterning and RIE. Thereby, a portion of the P doped n-type diamond layer 11f is exposed.

Figure 9D:
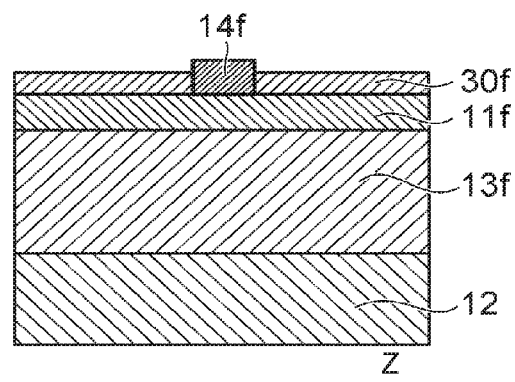

Then, as illustrated in FIG. 9D, a p-type diamond layer 14f that forms the second p-type semiconductor layer 14 is formed on the exposed portion of the P doped n-type diamond layer 11f. The microwave plasma CVD method can be used for forming the p-type diamond layer 14f. For example, if surface treatment is not performed on the diamond, it is difficult for growth to occur except on the top of the diamond. Therefore, the p-type diamond layer 14f can be easily selectively grown on the exposed portion of the surface of the P doped n-type diamond layer 11f.

Figure 9E:
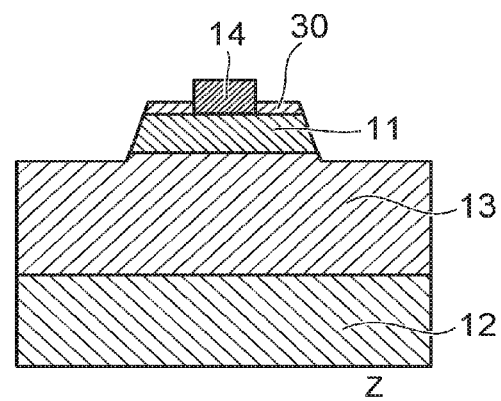

As illustrated in FIG. 9E, a portion of the undoped intrinsic semiconductor diamond layer 13f, a portion of the P doped n-type diamond layer 11f, and a portion of the Si doped n-type AlGaN layer 30f are removed, to form a mesa structure. For example, patterning and RIE can be used for removing these.

Figure 9F:
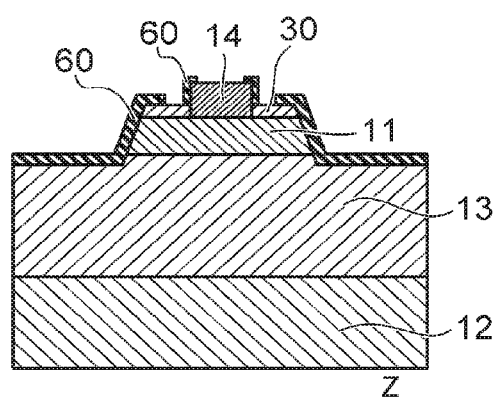

As illustrated in FIG. 9F, the insulating layer 60 is formed. For example, silicon oxide that forms the insulating layer 60 is formed by the CVD method or the like. A portion of the silicon oxide film corresponding to a portion in contact with the first electrode 40 and a portion in contact with the third electrode 70 is removed by patterning and etching. Thereby, the insulating layer 60 is formed.

Then, a conductive film that forms the first electrode 40 is formed on the exposed nitride semiconductor layer 30 and on the insulating layer 60. A conductive film that forms the second electrode 50 is formed on the bottom surface of the p-type semiconductor layer 12. In addition, a conductive film that forms the third electrode 70 is formed on the second p-type semiconductor layer 14. Here, a stacked film of Ti/Pt/Au is used as these conductive films. Electron beam vapor deposition is used for forming the conductive film.

Then, annealing is carried out. The annealing temperature is, for example, not less than 500° C. and not more than 700° C., and in this example, is 600° C. The annealing time is not less than 10 minutes and not more than 60 minutes, and in this example, is 30 minutes.

As a result of the above processes, the semiconductor device 130 is formed. In the current-voltage characteristic of the semiconductor device 130, the rectification ratio at ±10 V is, for example, not less than $1 \times 10^{10}$. The current amplification factor is, for example, not less than 100. The withstand voltage is not less than 10 kV. The on resistance is not more than 200 mΩcm$^2$. In this way, the semiconductor device 130 has a high withstand voltage, and the on voltage is low.

In the above, a vertical pin diode and a bipolar transistor were described as embodiments. However, the embodiments may be a pn diode, a pseudo-vertical diode, or a horizontal diode. In addition, the embodiments can be applied to the ohmic contact of unipolar devices such as schottky barrier diodes using n-type diamond.

According to these embodiments, it is possible to provide a semiconductor device with low on voltage.

Note that, in this specification, "nitride semiconductor" includes $B_xIn_yAl_zGa_{(1-x-y-z)}N$ (where $0 \le x \le 1$, $0 \le y \le 1$, $0 \le z \le 1$, and $0 \le x+y+z \le 1$) group III-V compound semiconductors, and furthermore includes mixed crystals containing phosphorus (P) and/or arsenic (As) in addition to nitrogen (N) as group V elements. Furthermore, "nitride semiconductor" shall also be understood to include semiconductors further containing various elements added to control various physical properties such as conductivity type, and semiconductors further containing various elements that are included unintentionally.

In the specification of the application, "perpendicular" refers to not only strictly perpendicular but also include, for example, the fluctuation due to manufacturing processes, etc. It is sufficient to be substantially perpendicular.

Hereinabove, embodiments of the invention are described with reference to specific examples. However, the invention is not limited to these specific examples. For example, one skilled in the art may similarly practice the invention by appropriately selecting specific configurations of components such as the n-type semiconductor layer, the first electrode, the nitride semiconductor layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
an n-type semiconductor layer including diamond;
a first electrode; and
a nitride semiconductor layer provided between the n-type semiconductor layer and the first electrode, the nitride semiconductor layer being of n-type,
the nitride semiconductor layer including a structural body including a plurality of $Al_xGa_{1-x}N$ ($0<x\le1$) layers and a plurality of $Al_yGa_{1-y}N$ ($0\le y<x$) layers,
the $Al_xGa_{1-x}N$ ($0<x\le1$) layers and the $Al_yGa_{1-y}N$ ($0\le y<x$) layers being arranged alternately in a first direction from the n-type semiconductor layer toward the first electrode.

2. The device according to claim 1, wherein the structural body includes a plurality of $Al_{x1}Ga_{1-x1}N$ ($0\le x1<1$) layers and a plurality of AlN layers,
the $Al_{x1}Ga_{1-x1}N$ ($0\le x1<1$) layers and the AlN layers are arranged alternately in the first direction.

3. The device according to claim 1, wherein
the structural body includes a plurality of GaN layers and a plurality of $Al_{x2}Ga_{1-x2}N$ ($0<x2\le1$) layers,
the GaN layers and the $Al_{x2}Ga_{1-x2}N$ ($0<x2\le1$) layers are arranged alternately in the first direction.

4. The device according to claim 1, wherein the x is not less than 0.7 and not more than 0.9.

5. The device according to claim 1, wherein
the nitride semiconductor layer includes a first region and a second region, the first region including $Al_xGa_{1-x}N$ ($0<x\le1$), the second region including $Al_yGa_{1-y}N$ ($0\le y<x$), and
the first region is provided between the second region and the n-type semiconductor layer.

6. The device according to claim 5, wherein
the x is not less than 0.7 and not more than 0.9, and
the y is not less than 0.4 and not more than 0.6.

7. The device according to claim 5, wherein
the first region includes a plurality of AlN layers and a plurality of $Al_xGa_{1-x}N$ ($0<x\le1$) layers, the AlN layers and the $Al_xGa_{1-x}N$ ($0<x\le1$) layers being arranged alternately in a first direction from the n-type semiconductor layer toward the first electrode,
the second region includes a plurality of GaN layers and a plurality of $Al_yGa_{1-y}N$ ($0\le y<x$) layers, the GaN layers and the $Al_yGa_{1-y}N$ ($0\le y<x$) layers being arranged alternately in the first direction, and
an average Al composition ratio in the first region is higher than an average Al composition ratio in the second region when a thickness of the first region is t1 (nanometers), a thickness of the second region is t2 (nanometers), a total thickness of the AlN layers is ta (nanometers), a total thickness of the $Al_xGa_{1-x}N$ ($0<x\le1$) layers is tx (nanometers), a total thickness of the $Al_yGa_{1-y}N$ ($0\le y<x$) layers is ty (nanometers), the average Al composition ratio of the first region is $(ta+x\times tx)/t1$, and the average Al composition ratio of the second region is $(y\times ty)/t2$.

8. The device according to claim 7, wherein
the average Al composition ratio in the first region is not less than 0.7 and not more than 0.9, and
the average Al composition ratio in the second region is not less than 0.4 and not more than 0.6.

9. The device according to claim 1, wherein the first electrode includes at least one selected from Ti, Mo, Ta, Zr, and Hf.

10. The device according to claim 1, further comprising a first p-type semiconductor layer including diamond,
the n-type semiconductor layer being positioned between the first electrode and the first p-type semiconductor layer.

11. The device according to claim 10, further comprising a second electrode electrically connected to the first p-type semiconductor layer.

12. The device according to claim 10, further comprising an intermediate semiconductor layer provided between the n-type semiconductor layer and the first p-type semiconductor layer, the intermediate semiconductor layer including diamond,
an impurity concentration in the intermediate semiconductor layer being lower than an impurity concentration in the n-type semiconductor layer, and being lower than an impurity concentration in the first p-type semiconductor layer.

13. The device according to claim 10, further comprising a second p-type semiconductor layer including diamond,
the n-type semiconductor layer including a portion provided between the first p-type semiconductor layer and the second p-type semiconductor layer.

14. The device according to claim 13, wherein the second p-type semiconductor layer is arranged with the nitride semiconductor layer in a direction intersecting a first direction from the n-type semiconductor layer toward the first electrode.

15. The device according to claim 14, further comprising a third electrode electrically connected to the second p-type semiconductor layer.

16. The device according to claim 1, wherein the nitride semiconductor layer has a first side face intersecting a plane perpendicular to a first direction from the n-type semiconductor layer toward the first electrode,
the n-type semiconductor layer has a second side face intersecting the plane, and
the second side face is along a plane including the first side face.

17. The device according to claim 16, further comprising an insulating layer,
the nitride semiconductor layer further including a first face and a second face, the first face being in contact with the n-type semiconductor layer, one portion of the second face being in contact with the first electrode,
the insulating layer being in contact with one other portion of the second face, the first side face, and the second side face.

18. The device according to claim 17, wherein
the insulating layer includes a portion disposed in at least one selected from a first position, a second position, and a third position,
the first position is between the first electrode and the second face,
the second position is between the first electrode and the first side face, and
the third position is between the first electrode and the second side face.

* * * * *